Dec. 4, 1956 N. J. REGNIER 2,773,187
CRYSTAL OSCILLATOR CIRCUITS OR THE LIKE
Filed Feb. 1, 1954
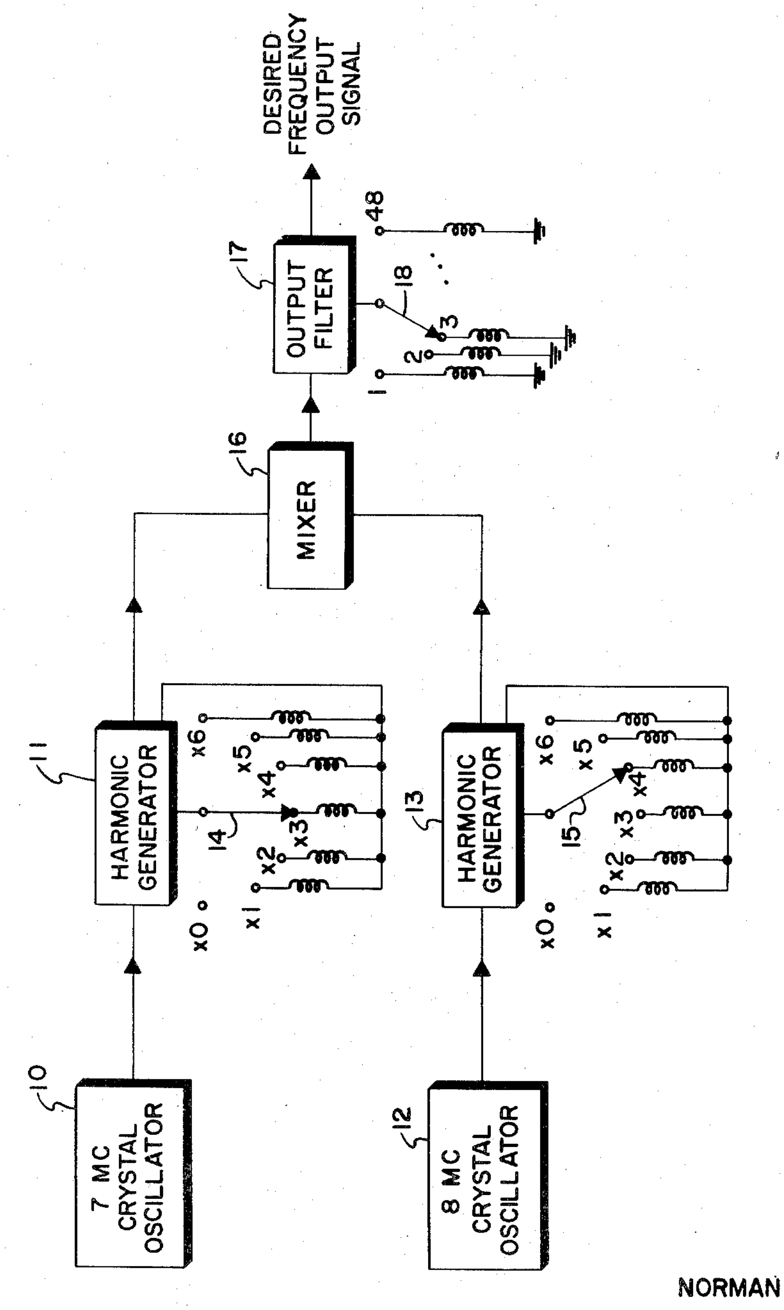
NORMAN J. REGNIER
*INVENTOR.*
BY Bruce L. Birchard
HIS ATTORNEY 2,773,187
Patented Dec. 4, 1956

2,773,187

CRYSTAL OSCILLATOR CIRCUITS OR THE LIKE

Norman J. Regnier, San Leandro, Calif., assignor to Hoffman Electronics Corporation, a corporation of California Application February 1, 1954, Serial No. 407,413
4 Claims. (Cl. 250—36)

This invention is related to crystal-controlled oscillator circuits and more particularly to an improved crystal-controlled oscillator circuit which will generate a plurality of pre-set high-frequency signals with a minimum number of crystals and switching circuits.

In the past, many circuits have been employed to generate multiple frequencies spaced one megacycle apart. It is the usual practice to obtain these multiple frequencies in one of two ways. The first is to use a one megacycle crystal and multiply it to the desired frequency. In this case the crystal frequency would be multiplied many times to obtain the desired spread of frequencies. This means that a great many tuned circuits and switching circuits are needed. The second common method of obtaining multiple frequencies is to use a large number of crystals, multiplying each crystal frequency from one to six times in order to obtain the desired spaced frequencies. This latter method also employs a great number of switching circuits, and also many crystal units. Obviously, it is desirable to reduce the number of switching circuits and crystals employed in such multiple frequency oscillator circuits presently in use.

Therefore, it is an object of this invention to provide an improved crystal-controlled oscillator circuit for generating multiple frequencies.

It is a further object of this invention to provide an improved crystal-controlled oscillator circuit for generating multiple frequencies which will employ a minimum number of crystals, and a minimum number of tuned circuits and switching circuits, so as to lend the oscillator design to low cost manufacture.

According to this invention, two crystals whose frequencies are one magacycle apart are so chosen that when their respective frequencies are multiplied an integral number of times and subsequently added or subtracted by intermodulation means and filter means the resultant frequencies will be spaced one megacycle apart and cover a desired frequency range. This result will be accomplished when the frequencies of these two crystals and their respective multiplier ranges satisfy the following simultaneous equations:

$$\pm a(x) \pm b(y) = z$$

$$x - y = 1 \text{ (mc. if } x \text{ and } y \text{ are in mc., etc.)}$$

where $x$=one crystal frequency
$a$=multiplying factor of frequency $x$
$y$=second crystal frequency
$b$=multiplying factor of frequency $y$, and
$z$=the desired frequency.

In practice, the multiplied crystal frequencies, i. e., $a(x)$ and $b(y)$ should be limited to reasonable values, i. e., less than 50 megacycles.

The features of the present invention which are believed to be novel are set forth with particularity in the appended claims. The present invention, both as to its organization and manner of operation, together with further objects and advantages thereof, may best be understood by reference to the following description taken in connection with the accompanying drawing, in which the sole figure is a block diagram of a crystal-controlled oscillator for generating multiple frequencies according to this invention.

In the sole figure, crystal-controlled oscillator stage 10, having a seven megacycle crystal, is connected to harmonic generator stage 11. Crystal-controlled oscillator stage 12, having an eight megacycle crystal, is connected to harmonic generator stage 13. Harmonic generator stages 11 and 13 are so designed to generate selectively a first, second, third, fourth, fifth, or sixth harmonic of the respective oscillation frequency by proper positioning of selecting arm 14 or arm 15, respectively. Arms 14 and 15 may also be placed at a zero position, this placement effectively opening the circuits between the respective harmonic generators and mixer stage 16.

The output circuit of harmonic generator stage 11 is connected to a first input circuit of mixer stage 16, and the output circuit of harmonic generator stage 13 is connected to the second input circuit of mixer stage 16. The output circuit of mixer stage 16 is connected to filter stage 17 which may be adjusted by means of frequency selecting arm 18 to provide a signal at the desired output frequency.

The circuit operates as follows:

The frequencies of the output signals from crystal oscillator stages 10 and 12 are multiplied when passed through harmonic generator stages 11 and 13, respectively. The multiplication factor of each generator stage, ranging between 0 and 6, is determined by the selective positioning of arms 14 and 15. Signals at the resultant frequencies are simultaneously fed to mixer stage 16 to be intermodulated. The output signal at a desired frequency is selected from the output signal of mixer stage 16 by output filter stage 17. Filter selectivity is accomplished by the proper positioning of arm 18. The resultant signal from output filter stage 17 is ready for use.

The aforementioned simultaneous equations may now be recalled:

$$\pm a(x) \pm b(y) = z$$

and $$x - y = 1 \text{ mc.}$$

The particular embodiment of this invention above described utilizes the following set of values:

$$x = 8 \text{ mc.}$$
$$y = 7 \text{ mc.}$$
$$o \leq a \leq 6$$
$$o \leq b \leq 6$$

where $a$ and $b$ are each a range of integers. The following table illustrates that by substituting these values in the above equations, this substitution being effected through the proper positioning of selecting arms 14, 15, and 18, output frequencies of from 1 to 48 megacycles may be obtained.

| Desired Frequency (mc.) | Multiplication Factor in Generator 13 | Crystal Frequency (mc.) | Add/ Subtract | Multiplication Factor in Generator 11 | Crystal Frequency (mc.) |
|---|---|---|---|---|---|
| 1 | 1x | 8 | − | 1x | 7 |
| 2 | 2x | 8 | − | 2x | 7 |
| 3 | 3x | 8 | − | 3x | 7 |
| 4 | 3x | 8 | − | 4x | 7 |
| 5 | 3x | 7 | − | 2x | 8 |
| 6 | 2x | 7 | − | 1x | 8 |
| 7 | 1x | 7 | + | 0x | 8 |
| 8 | 1x | 8 | + | 0x | 7 |
| 9 | 2x | 8 | − | 1x | 7 |
| 10 | 3x | 8 | − | 2x | 7 |
| 11 | 5x | 7 | − | 3x | 8 |
| 12 | 4x | 7 | − | 2x | 8 |
| 13 | 3x | 7 | − | 1x | 8 |
| 14 | 2x | 7 | + | 0x | 8 |
| 15 | 1x | 8 | + | 1x | 7 |
| 16 | 2x | 8 | + | 0x | 7 |
| 17 | 3x | 8 | − | 1x | 7 |
| 18 | 4x | 8 | − | 2x | 7 |
| 19 | 5x | 7 | − | 2x | 8 |
| 20 | 4x | 7 | − | 1x | 8 |
| 21 | 3x | 7 | + | 0x | 8 |
| 22 | 2x | 7 | + | 1x | 8 |
| 23 | 2x | 8 | + | 1x | 7 |
| 24 | 3x | 8 | + | 0x | 7 |
| 25 | 4x | 8 | − | 1x | 7 |
| 26 | 5x | 8 | − | 2x | 7 |
| 27 | 5x | 7 | − | 1x | 8 |
| 28 | 4x | 7 | + | 0x | 8 |
| 29 | 3x | 7 | + | 1x | 8 |
| 30 | 2x | 7 | + | 2x | 8 |
| 31 | 3x | 8 | + | 1x | 7 |
| 32 | 4x | 8 | + | 0x | 7 |
| 33 | 5x | 8 | − | 1x | 7 |
| 34 | 6x | 8 | − | 2x | 7 |
| 35 | 5x | 7 | + | 0x | 8 |
| 36 | 4x | 7 | + | 1x | 8 |
| 37 | 3x | 7 | + | 2x | 8 |
| 38 | 3x | 8 | + | 2x | 7 |
| 39 | 4x | 8 | + | 1x | 7 |
| 40 | 5x | 8 | + | 0x | 7 |
| 41 | 6x | 8 | − | 1x | 7 |
| 42 | 6x | 7 | + | 0x | 8 |
| 43 | 5x | 7 | + | 1x | 8 |
| 44 | 4x | 7 | + | 2x | 8 |
| 45 | 3x | 8 | + | 3x | 7 |
| 46 | 4x | 8 | + | 2x | 7 |
| 47 | 5x | 8 | + | 1x | 7 |
| 48 | 6x | 8 | + | 0x | 7 |

It is apparent, then, from the above table that crystal frequencies of 7 and 8 megacycles and multiplier ranges of from 0 to 6 satisfy the two simultaneous equations aforementioned, and also meet the requirement that all multiplied frequencies be less than 50 megacycles. It may easily be shown that crystal frequencies of 6 and 7 megacycles will also render possible, by virtue of the design of the circuit shown in the sole figure, the production of a spectrum of frequencies from 1 megacycle to 48 megacycles exhibiting a signal spacing of 1 megacycle throughout the spectrum. Conceivably, other combinations of crystal frequencies, in which the frequency difference between the same represents an odd-integer, may likewise be employed.

From the foregoing it is seen that this invention satisfies the requirement of providing a number of frequencies with the employment of only two crystals, a considerable achievement in light of the fact that multiple pre-set frequency generator circuits currently in use require a considerably greater number of crystals and switching circuits.

It is to be noted that the input signal frequencies to harmonic generators 11 and 13 are multiplied by a factor of 6 or less. Practical necessity limits the degree of multiplication since for higher degrees of multiplication the output signal from harmonic generators 11 and 13 would seriously decrease. In such a case one or two stages of amplification would be needed to amplify the output signal from output filter 17. Hence, the multiplication factors employed in the present invention are low, i. e., 6 or less.

In actual practice, the selecting circuits of harmonic generator stages 11 and 13 and output filter stage 17 may be interconnected and ganged so that each of the desired frequencies may be obtained by properly positioning a single band-switch.

While particular embodiments of the present invention have been shown and described, it will be obvious to those skilled in the art that changes and modifications may be made without departing from this invention in its broader aspects, and therefore, the aim in the appended claims is to cover all such changes and modifications as fall within the true spirit and scope of this invention.

I claim:

1. A selectable frequency signal generator for generating a plurality of signal frequencies having a uniform frequency spacing including, in combination, a first crystal-controlled oscillator, means responsive to the output signal from said first oscillator for selectively multiplying the frequency of said signal by one of a plurality of low multiplication factors, a second crystal-controlled oscillator having a frequency of 1 megacycle removed from the frequency of said first crystal-controlled oscillator, means responsive to the output signal from said second oscillator for selectively multiplying the frequency of such signal by one of a plurality of low multiplication factors, intermodulation means responsive to the output signals from both frequency multiplying means for intermodulating such signals, filter means responsive to the output signal from said intermodulation means to pass selectively signals at the desired frequency, and said oscillator frequencies ($x$ and $y$) and said multiplication factor ranges ($a$ and $b$) of each of said frequency multiplying means satisfying the following equations:

$$\pm a(x)+b(y)=z$$

$x-y=1$ (mc. where $x$ and $y$ are in mc.)

where $z$ is a desired frequency.

2. Apparatus according to claim 1 in which said crystal-controlled oscillator frequencies $x$ and $y$ ar 8 megacycles and 7 megacycles, respectively.

3. A selectable frequency signal generator for generating a plurality of signal frequencies having a uniform frequency spacing including, in combination, a first crystal-controlled oscillator, means responsive to the output signal from said first oscillator for selectively multiplying the frequency of said signal by one of a plurality of low multiplication factors, a second crystal-controlled oscillator having a frequency 1 C-cycle removed from the frequency of said first crystal-controlled oscillator, means responsive to the output signal from said second oscillator for selectively multiplying the frequency of such signal by one of a plurality of low multiplication factors, intermodulation means responsive to the output signals from both frequency multiplying means for intermodulating such signals, filter means responsive to the output signal from said intermodulation means to pass selectively signals at the desired frequency, and said oscillator frequencies ($x$ and $y$) and said multiplication factor ranges ($a$ and $b$) of each of said frequency multiplying means satisfying the following equations:

$$\pm a(x)+b(y)=z$$

$x-y=1$ (C-cycle where $x$ and $y$ are in C-cycles, and where the prefix C- designates, e. g., mega or kilo)

where $z$ is a desired frequency.

4. A selectable frequency signal generator for generating a plurality of signal frequencies having a uniform frequency spacing including, in combination, a first crystal-controlled oscillator, means responsive to the output signal from said first oscillator for selectively multiplying the frequency of said signal by one of a plurality of low multiplication factors, a second crystal-controlled oscillator having a frequency an odd-integer number of C-cycles removed from the frequency of said first crystal-controlled oscillator, means responsive to the output signal from said second oscillator for selectively multiplying the frequency of such signal by one of a plurality of low multiplication factors, intermodulation means responsive to the output signals from both frequency multiplying means for intermodulating such signals, filter means responsive to the output signal from said intermodulation means to pass selectively signals at the desired frequency, and said oscillator frequencies ($x$ and $y$) and said multiplication factor ranges ($a$ and $b$) of each of said frequency multiplying means satisfying the following equations:

$$\pm a(x)+b(y)=z$$

$x-y$=an odd integer (C-cycle where $x$ and $y$ are in C-cycles, and where the prefix C- designates, e. g., mega or kilo)

where $z$ is a desired frequency.

References Cited in the file of this patent

UNITED STATES PATENTS

| | | |
|---|---|---|
| 2,445,664 | Doelz | July 20, 1948 |
| 2,617,039 | Young | Nov. 4, 1952 |
| 2,648,006 | Mabry | Aug. 4, 1953 |
| 2,679,005 | Bataille et al. | May 18, 1954 |